(12) United States Patent
Yang et al.

(10) Patent No.: US 7,053,462 B2
(45) Date of Patent: May 30, 2006

(54) PLANARIZATION OF METAL CONTAINER STRUCTURES

(75) Inventors: Sam Yang, Boise, ID (US); John M. Drynan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 10/309,114

(22) Filed: Dec. 4, 2002

(65) Prior Publication Data

US 2003/0082903 A1 May 1, 2003

Related U.S. Application Data

(62) Division of application No. 09/653,280, filed on Aug. 31, 2000, now Pat. No. 6,524,912.

(51) Int. Cl.
*H01L 29/00* (2006.01)
*H01L 29/40* (2006.01)
*H01L 23/48* (2006.01)
*H01L 23/52* (2006.01)

(52) U.S. Cl. ............... 257/534; 257/757; 257/748; 257/764; 257/769; 257/774; 257/602; 257/532

(58) Field of Classification Search ............ 257/758, 257/741, 748, 752, 750, 757, 764, 768, 770, 257/774, 769, 602, 532, 534
See application file for complete search history.

(56) References Cited

U.S. PATENT DOCUMENTS

| 5,250,467 A | 10/1993 | Somekh et al. |
| 5,827,777 A | 10/1998 | Schinella et al. |
| 5,950,092 A | 9/1999 | Figura et al. |
| 6,020,259 A | 2/2000 | Chen et al. |
| 6,046,099 A | 4/2000 | Cadien et al. |
| 6,107,200 A * | 8/2000 | Takagi et al. ............... 438/685 |
| 6,140,241 A | 10/2000 | Shue et al. |

(Continued)

FOREIGN PATENT DOCUMENTS

WO    WO 99/04434    1/1999

OTHER PUBLICATIONS

Drynan J. M. et al. "Cylindrical Full Metal Capacitor Technology for High-speed Gigabit DRAMs" IEEE Symposium on VLSI Technology Digest of Technical Papers, 1997, pp. 151-152, XP010245838.

(Continued)

*Primary Examiner*—Evan Pert
*Assistant Examiner*—Victor A. Mandala, Jr.
(74) *Attorney, Agent, or Firm*—Dickstein Shapiro Morin & Oshinsky LLP

(57) ABSTRACT

A conductive material is provided in an opening formed in an insulative material. The process involves first forming a conductive material over at least a portion of the opening and over at least a portion of the insulative material which is outside of the opening. Next, a metal-containing fill material is formed over at least a portion of the conductive material which is inside the opening and which is also over the insulative material outside of the opening. The metal-containing material at least partially fills the opening. At least a portion of both the metal-containing fill material and the conductive material outside of the opening is then removed. Thereafter, at least a portion of the metal-containing fill material which is inside the opening is then removed.

15 Claims, 8 Drawing Sheets

U.S. PATENT DOCUMENTS

| | | |
|---|---|---|
| 6,168,991 B1 | 1/2001 | Choi et al. |
| 6,265,305 B1 | 7/2001 | Tsou et al. |
| 6,278,187 B1 * | 8/2001 | Takata et al. ............... 257/758 |
| 6,316,353 B1 | 11/2001 | Selsley |
| 6,346,741 B1 | 2/2002 | Van Buskirk et al. |
| 6,445,023 B1 | 9/2002 | Vaartstra et al. |
| 6,465,828 B1 * | 10/2002 | Agarwal .................... 257/296 |
| 6,524,912 B1 * | 2/2003 | Yang et al. ................. 438/258 |
| 6,537,912 B1 * | 3/2003 | Agarwal .................... 438/687 |
| 6,541,864 B1 * | 4/2003 | Fukuzumi ................... 257/758 |
| 6,656,826 B1 * | 12/2003 | Ishimaru .................... 438/612 |
| 6,815,819 B1 * | 11/2004 | Li ............................... 257/751 |
| 6,858,937 B1 * | 2/2005 | Cho .......................... 257/774 |
| 6,936,924 B1 * | 8/2005 | Fukuzumi ................... 257/758 |
| 6,967,409 B1 * | 11/2005 | Segawa et al. ............. 257/774 |
| 2002/0055234 A1 | 5/2002 | Agarwal |
| 2002/0056864 A1 * | 5/2002 | Agarwal ..................... 257/296 |
| 2002/0195715 A1 * | 12/2002 | Cho .......................... 257/774 |

OTHER PUBLICATIONS

International Search Report, May 31, 2002, Int'l Application No.: PCT US 01/27138.

* cited by examiner

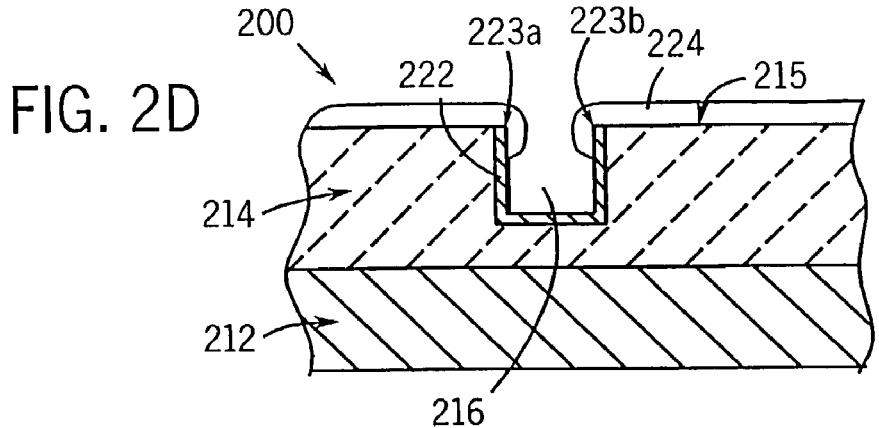
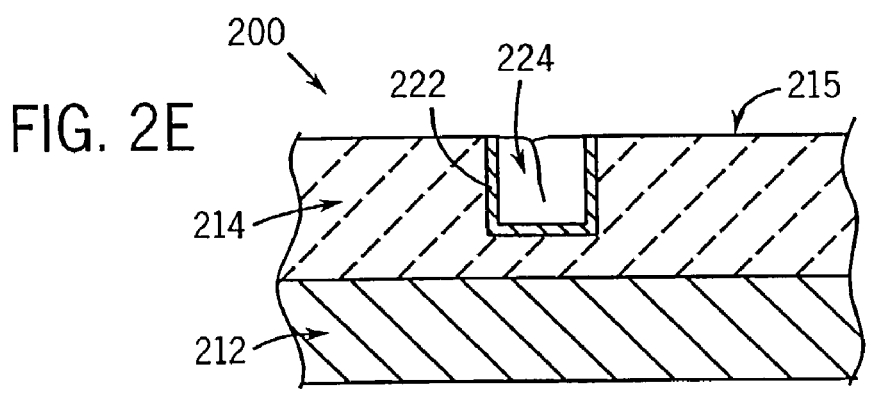
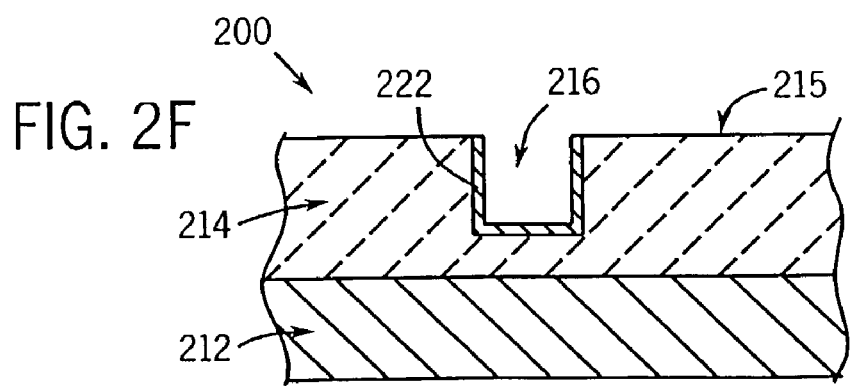

PLANARIZATION OF METAL CONTAINER STRUCTURES

This application is a divisional application of U.S. patent application Ser. No. 09/653,280, filed on Aug. 31, 2000 now U.S. Pat. No. 6,524,912, the entirety of which is incorporated herein by reference.

FIELD OF THE INVENTION

The present invention relates generally to the fabrication of semiconductive devices, and more particularly; to a method of forming conductive material in an opening in a semiconductive device. The invention also relates to the structures formed according to the various embodiments of the method herein set forth.

BACKGROUND OF THE INVENTION

In the fabrication of integrated circuits, various layers, e.g. conductive layers and insulative layers, are formed. For example, during the formation of semiconductive devices, such as dynamic random access memories (DRAMs), insulating layers are used to electrically separate conductive layers such as doped polycrystalline silicon, aluminum, metal silicides, etc. It is often required that the conductive layers be interconnected through holes or openings in the insulating layers. Such openings are commonly referred to as contact holes, e.g. when the opening extends through an insulating layer to an active area, or vias, e.g. when the opening extends through an insulating layer between two conductive layers. The profile of an opening is of particular importance such that specific characteristics can be achieved when a contact hole or via is provided and then filled with one or more conductive materials.

Conductive materials are also formed in openings when providing certain storage cell capacitors for use in semiconductive devices, e.g. DRAMs. Storage capacity and size are important characteristics of a storage cell. Generally, a storage cell is formed with a dielectric constant material interposed between two conductive electrodes. One or more layers of various conductive materials may be used as the electrode material.

Container-type cell capacitor structures generally include the formation of an insulative layer over existing topography which has been formed over a substrate, and then openings are etched into the insulative layer. These openings allow access to the underlying topography, e.g. for a cell capacitor, which may include conductive regions, e.g. conductive plugs, active substrate regions, etc. Thereafter, a conductive layer to be used for forming the bottom electrode of the cell capacitor is formed within the openings, and may also be formed on the upper surface of the insulative layer as well. A layer of oxide material may then be used to fill the opening over the conductive material. Thereafter, this oxide material is removed to expose the layer of conductive material. The exposed layers of conductive material which are outside of the opening, e.g. which are over the top surface of the insulative layer, are then removed to separate neighboring conductive openings, thereby forming individual containers with exposed insulative material between them. Next, the oxide material still filing the conductive opening is removed, leaving the opening lined with a bottom electrode for use in forming the container-type cell capacitor.

Storage capacity and size are important characteristics in a storage cell. One way to retain the storage capacity of a device and decrease its size is to increase the dielectric constant of the dielectric layer of the storage cell capacitor. Therefore, preferably a high dielectric constant material is utilized in applications interposed between two electrodes. Many conductive metals such as platinum, rhodium, iridium, osmium, as well as other Group VIII metals, and other transition element metals, e.g. copper, silver and gold, and Group IIIa and IVa metals, e.g. aluminum, and their alloys are desirable electrode materials for such high dielectric constant capacitors.

However, many of the foregoing metals, e.g. Group VIII metals such as platinum or platinum alloys such as platinum-rhodium, are not easily planarized. An illustrative planarization problem is shown in FIG. 1A. FIG. 1A shows a cross-sectional portion of a semiconductive device 10. An insulative layer 12 is formed over a substrate 11. An opening 15 is formed in the insulative layer 12 which stops on the surface of the substrate 11. To form a lower electrode or bottom electrode of a capacitor-type structure, a metal layer 20 is formed over the insulative layer and as a lining in opening 15. Thereafter, a photoresist layer 25 is formed over the metal layer 20 to completely fill the opening 15. Upon plananzation, the upper portion of layer 25 is removed along with the metal portion 20 which is outside of the opening 15, resulting in the non-dashed lining portion 30. However, as shown in FIG. 1A, the metal is often deformed or smeared at the upper region or edge of the opening 15. The metal material is pushed into the center of the container opening 15 as represented by projection 35 during the planarization process. Such deformation of the metal in the container opening 15 produces an undesirable profile and is further problematic in removing the resist material 25 from within the opening 15.

As shown in FIG. 1B, a further problem associated with the use of a metal is shown wherein the metal layer 20 is not planarized, but instead is etched. However, upon wet etching the metal layer 20 back to the insulative layer 12, the photoresist layer 25 is pulled back away from the metal layer, thereby allowing for undesirable removal of portions of the metal layer as shown by the undesirably etched regions 40 in FIG. 1B.

Thus, there exists a need in the art for a new method of forming conductive material in openings in semiconductive devices. There is also a need for better structures containing conductive material formed therein.

SUMMARY OF THE INVENTION

In accordance with the invention, there is set forth a method of providing a conductive material in an opening. The process involves first forming a conductive material in the opening and over at least a portion of the insulative material which is outside of the opening. Next, a metal-containing fill material is formed over at least a portion of the conductive material such that at least some of the metal-containing material is located in the opening. At least a portion of the conductive material outside of the opening is then removed. Thereafter, at least a portion of the metal-containing fill material which is inside the opening is then removed.

The invention further provides a method of forming a bottom electrode of a capacitor. A second conductive material is provided within an opening in contact the first conductive material. The second conductive material is also provided over at least a portion of an insulative material which is outside of the opening. Next, a metal-containing fill material is provided over at least a portion of the conductive material which is inside the opening and which is over the insulative layer as well. At least a portion of the metal-containing fill material which is inside the opening is next removed and the second conductive material thereby forms the bottom electrode of a capacitor.

Also included is a method of providing a conductive material in an opening which has been provided in an insulative material over a substrate, wherein the opening contacts a surface portion of the substrate. First, a conductive material is deposited over at least a portion of the inside of the opening and over at least a portion of the surface of the insulative material which is outside the opening. Next, a tungsten-containing fill material is deposited over at least a portion of the conductive material which is over the surface portion of the substrate and which is over the insulative material outside of the opening. At that point, the tungsten material at least partially fills the opening. At least a portion of the tungsten-containing fill material and the conductive material which is over the insulative material outside the opening is then removed. The removal is effected by planarization. Next, at least a portion of the tungsten-containing fill material is removed from the opening.

According to another aspect of the invention, a structure comprises a substrate with an insulative material over the substrate. There is also a conductive material formed over at least a portion of the surface of the opening and over at least a portion of the insulative material which is outside the opening. A tungsten-containing fill material is formed over at least a portion of the conductive material which is inside the opening and which is over the insulative material outside the opening, such that the tungsten-containing fill material at least partially fills the opening.

Another structure of the invention also contains a substrate and an insulative material over the substrate. A conductive material is formed over substantially all of the inside surface of the opening. A tungsten-containing fill material is formed over the conductive material and substantially fills the opening. The conductive material and the tungsten containing material are substantially co-planar at the top of the opening.

A further method of the invention is useful in forming a bottom electrode of a capacitor and a bit line conductive plug in a semiconductive device. A first opening is provided through the surface of an insulative material provided over a substrate in the device, such that at least a portion of the opening contacts a first conductive material. A second conductive material is then provided over at least a portion of the surface of the opening which is in contact with the first conductive material, as well as over at least a portion of the surface of the insulative material which is outside the opening. A protective layer is next provided over the second conductive material. A second opening is then provided through the protective layer and through the second conductive material which is over the insulative material, as well as through the insulative material. At least a portion of the second opening contacts a third conductive material. The protective layer is then removed. A metal-containing fill material is next provided over the second conductive material which is inside the first opening and which is over the insulative material outside of the opening.

The metal-containing fill material is further provided over the second opening such that the metal-containing fill material at least partially fills both the first and second openings. A bit line conductive plug is thereby formed in the second opening. Next, at least a portion of the metal-containing fill material and the conductive material which is over the insulative material outside of both openings is removed. Thereafter, at least a portion of the metal-containing fill material from the first opening is removed so as to form the bottom electrode of the capacitor.

The invention also provides a method of planarizing a conductive material formed over an opening without substantially deforming the material. The conductive material is contacted with a metal-containing fill material such that the fill material is over the conductive material and at least partially fills the opening. The conductive material and the metal-containing fill material are then planarized such that a top portion of the conductive material and the fill material are substantially co-planar with a top portion of the opening.

Additional advantages and features of the present invention will become more readily apparent from the following detailed description and drawings which illustrate various exemplary embodiments of the invention.

BRIEF DESCRIPTION OF THE DRAWINGS

FIG. 2D is also a cross-sectional view of device shown in FIG. 2B in a further stage of fabrication.

FIG. 2E is a cross-sectional view of the device shown in FIG. 2C in a further stage of fabrication.

FIG. 2F is a cross-sectional view of the device shown in FIG. 2F in a further stage of fabrication.

DETAILED DESCRIPTION OF PREFERRED EMBODIMENTS

The invention in its broadest embodiment is directed to a method of providing a conductive material in an opening in a semiconductive device, and to the structures formed therefrom.

Reference herein shall be made to the terms "substrate" and "wafer", which are to be understood as including silicon, a silicon-on-insulator (SOI) or silicon-on-sapphire (SOS) structures, doped and undoped semiconductives, epitaxial layers of silicon supported by a base semiconductive foundation, and other semiconductive structures. In addition, when reference is made to a "substrate" or "wafer" in the following description, previous process steps may have been utilized to form arrays, regions or junctions in or over the base semiconductive structure or foundation. In addition, the semiconductive material need not be silicon-based, but could be based on silicon-germanium, germanium, indium phosphide, or gallium arsenide. The term "substrate" as used herein may also refer to any type of generic base or foundation structure.

Figure 2A:
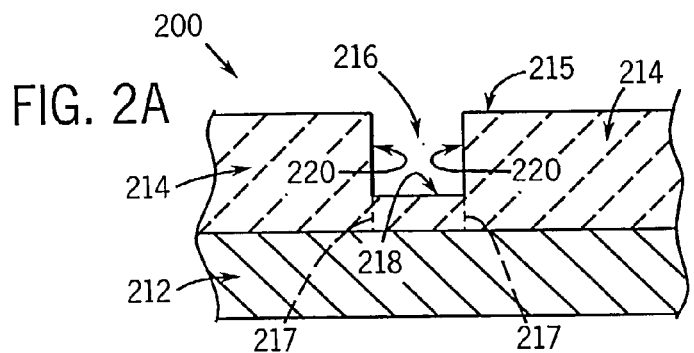
FIG. 2A is a cross-sectional view of a semiconductive device in an intermediate stage of fabrication.

Referring again to the drawings, FIG. 2A illustrates a semiconductive device 200 in an intermediate stage of fabrication. Shown is a substrate 212 and a layer 214 of material, preferably insulative material such as, for example, silicon dioxide or Boro-Phospho-Silicate Glass (BPSG), formed over the substrate 212. The layer 214 has a top surface 215. An opening 216 is formed in the layer 214 using methods known in the art, for example, wet and/or dry etching. The opening 216 can represent a contact opening or via, or even a trench or recess, and may or may not extend to the substrate surface (as represented by the dotted lines 217). The opening 216 includes a bottom surface 218 and side walls 220. Preferably, the bottom surface 218 is a generally horizontal surface from which the side walls 220 extend. The side walls 220 may be substantially orthogonal to the bottom surface 218, as shown in FIG. 2A, or they may be of another desired angle or shape, depending upon the particular environment of use for the opening. Moreover, the opening 216 defined by bottom surface 218 and side walls 220 can be any shape suitable to the needs of the skilled artisan, including a generally cylindrical shape.

Figure 2B:
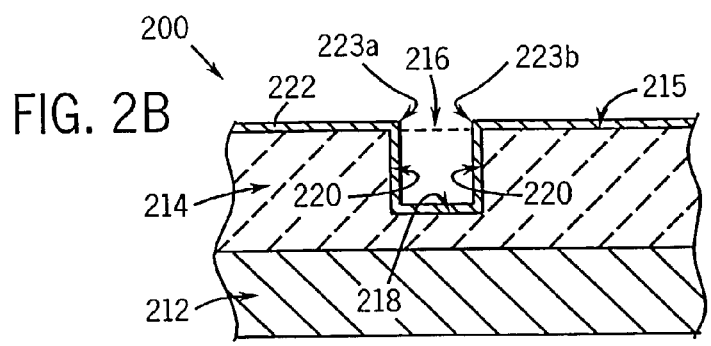
FIG. 2B is a cross-sectional view of the device shown in FIG. 2A in a further stage of fabrication.

Referring now to FIG. 2B, one illustrative method of forming a conductive material in the opening 216 is described. A conductive material 222 is formed over the surfaces 218, 220 which define the opening 216. The conductive material is formed over at least a portion of the surfaces 218, 220, and more desirably is formed over a majority or even substantially all of the inside surfaces 218, 220. The conductive material 222 is shown as a substantially conformal, single layer of material in FIG. 2B, but those skilled in the art will recognize that the conductive material 222 may or may not be conformal, and may also be comprised of two or more layers. The conductive material 222 is desirably made up of one or more Group VIII metals, together with their alloys and composites, and thus can include platinum, palladium, ruthenium, iridium, osmium and rhodium, and such alloys as platinum-rhodium. Platinum is the preferred conductive material 222 for use in the method of the invention. Other suitable conductive materials include other transition element metals, e.g. gold, copper and silver, as well as the Group IIIa and IVa metals, e.g. aluminum, together with their alloys and composites.

The conductive material 222 may be formed in the opening 216 using any suitable method, such as sputtering, chemical vapor deposition (CVD) or low pressure chemical vapor deposition (LPCVD), physical vapor deposition (PVD), electroplating and electroless plating. Preferably, the conductive material 222 is formed to a thickness within the range of a few Angstroms to several hundred Angstroms, which can vary according to the needs of the skilled artisan.

As further shown in FIG. 2B, the conductive material 222 preferably extends outside of the contact opening 216 and over the top surface 215 of the layer 214. The conductive material 222 is preferably formed over substantially the entire surface of the layer 214 as shown in FIG. 2B, or may be formed over any fraction thereof and subsequently etched back. Also shown in FIG. 2B are upper edges 223a and 223b of the conductive material 222. The upper edges 223a, 223b extend above the plane formed by the upper surface 215 of the layer 214, and they are bounded by the respective planes of the vertical lines extending upwards from the sidewalls 220 of the opening 216.

Figure 2C:
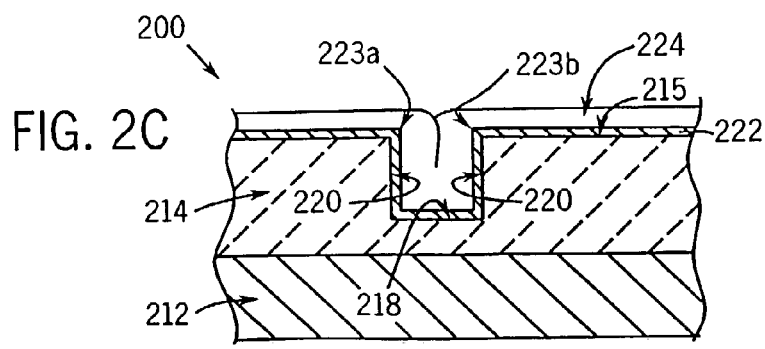
FIG. 2C is a cross-sectional view of the device shown in FIG. 2B in a further stage of fabrication.

Referring now to FIGS. 2C and 2D, after forming the conductive material 222, a fill material 224 is next deposited over the conductive material 222. The fill material 224 may be any suitable material which will protect the conductive material 222 from substantially deforming or smearing during a planarization step, hereinafter described. The fill material 224 should also be one which is itself capable of ultimate removal and/or planarization. The fill material 224 should also be substantially harder than the conductive material 222, and even more preferably, should be substantially harder than typical photoresist materials used in the semiconductive industry. Preferably, the fill material 224 is comprised substantially of a hard metal, and more desirably, a tungsten-containing metal, which can therefore include tungsten, tungsten alloys, tungsten composites as well as tungsten compounds. For example, tungsten nitride ($WN_x$) is one tungsten compound highly suitable as a fill material 224. The fill material 224 may be deposited using suitable deposition techniques such as CVD or LPCVD, using $WF_6$ and silane ($SiH_4$), for examples, as reactants. Other suitable fill material can include titanium-containing metals, which can include titanium, titanium alloys, titanium composites as well as titanium compounds such as, for example, titanium nitride (TiN).

Preferably, the fill material 224 extends into at least a portion of the opening 216 as shown in FIG. 2D, or substantially fills the opening 216 as illustrated in FIG. 2C. More preferably, the fill material 224 will substantially cover, or be substantially co-extensive with, the upper edges 223a, 223b of the conductive material 222. This particular embodiment is illustrated in both FIGS. 2C and 2D. Even more desirably, the fill material 224 will be substantially co-extensive with the conductive material 222 over the top surface 215 of the insulative layer 214. The fill material 224 will be distributed to have a thickness that is typically within the range of a few hundred Angstroms to several thousand Angstroms.

Referring now to FIG. 2E, the portions of the conductive material 222 and the fill material 224 which are outside of the opening 216 and which are over the top surface 215 of the layer 214 are next removed from the device 210. Preferably, removal is effected using a planarization technique which in general refers to the mechanical removal of material at a surface, and typically involves a flattening and polishing process used during semiconductive wafer fabrication. For example, such planarization may include chemical mechanical planarization (CMP), chemical mechanical polishing, planarization using pads and abrasive slurries, planarization using fixed abrasive pads either alone or in combination with slurries or other fluid compositions. Planarization is used to remove surface material for providing a flattening of surfaces of a wafer during the wafer fabrication process. The preferred method of removal is CMP. The removal or planarization process may also involve any number of actual process steps, e.g. repeated planarization for several periods of time, alternated by cleaning steps, etc.

Figure 1A:
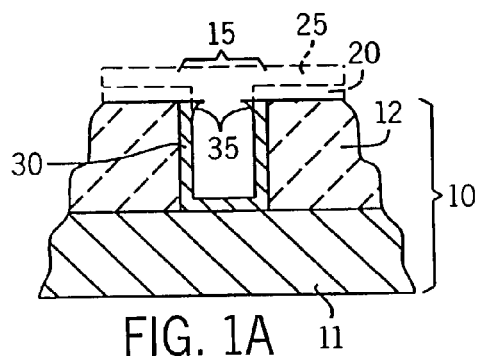
FIGS. 1A and 1B illustrate problems associated with planarizing conductive metal devices.
Figure 1B:
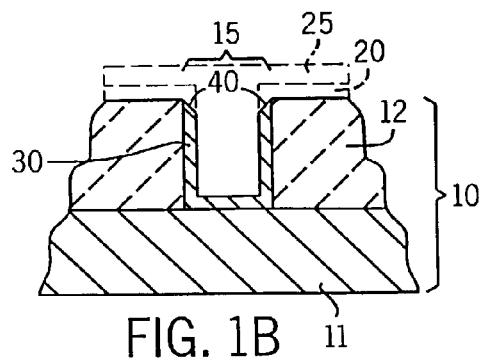

As shown in FIG. 2E, the fill material 224 functions to support and protect the underlying conductive material 222 during the removal/planarization step so that the conductive material 222 is substantially prevented from being smeared, scratched and pushed out of shape, e.g. caused to form the undesirable overhang into the opening 216, as was illustrated in FIG. 1A. Thus, the conductive material 222 remains substantially undeformed. After planarization is completed, the segments of the conductive material 222 and the overlying fill material 224 which were above the top surface 215 of the layer 214 are substantially all removed. Thus, in a preferred embodiment, the conductive material 222 at the top of the respective sidewalls 220 is substantially coplanar with the top surface 215 of the layer 214. In another preferred embodiment, the fill material left inside the opening 216 is also substantially co-planar with the top surface 215 of the layer 214.

Thereafter, as shown in FIG. 2F, substantially all of the remaining portion of the fill material 224 which is inside the opening 216 is removed from the device. Any method of removing the fill material may be utilized in the present invention. Preferably, a wet etch or dry etch process, or a combination thereof may be utilized to remove the fill material. If the fill material 224 is made up of the preferred tungsten or tungsten-containing material, e.g. tungsten nitride, then stripping in piranha can be used to remove this tungsten material from inside the opening 216. As a result of the removal step in FIG. 2F, the conductive material 222 is left intact inside the opening 216, substantially without being smeared or overhanging into the opening 216. Preferably, a conformal layer of conductive material 222 is left over the sidewalls 220 and the bottom surface 218 of the opening 216 as shown in FIG. 2F. The top surfaces of the side walls are still desirably substantially co-planar with the top surface 215 of the layer 214. The device 200 is now ready for further processing as desired by the person skilled in the art.

Figure 3A:
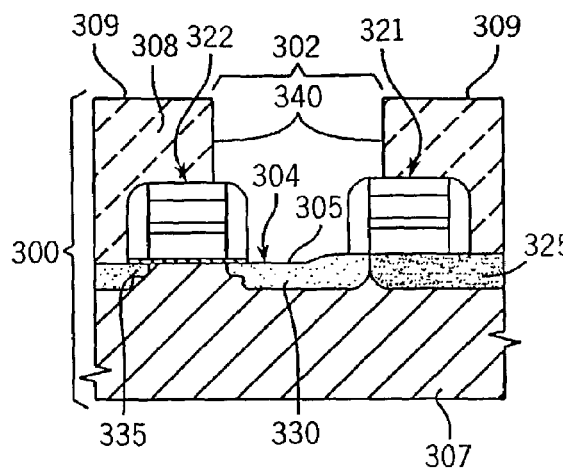
FIG. 3A is a cross-sectional view of a further embodiment of a semiconductive device in an intermediate stage of fabrication.

Referring now to FIG. 3A, there is shown an additional embodiment of the invention in another environment. A portion of a semiconductive device structure 300 is fabricated in accordance with conventional processing techniques through the formation of a contact opening 302 prior to metallization of the exposed contact area 304 of the surface portion 305 of the substrate 307. The contact opening 302 may be formed through layer 308, which is preferably a layer of insulative material such as BPSG or other suitable material, using suitable etching techniques, such as wet etching with hydrogen fluoride (HF) for example. Layer 308 has a top surface portion 309. Also shown are gate stack transistors 321 and 322 which each may alternately function as a word line or field effect transistor. The sides of the gate stack 321, 322 may be used to align the opening 302 to the substrate 307, and therefore the opening may be described as a self-aligned contact (SAC) opening. The device 300 further includes a field oxide region 325 formed in the substrate. Suitably doped source/drain regions 330 and 335 are formed in the substrate 307 between the gate stack transistors according to processes available to the skilled artisan. The opening 302 in FIG. 3A is further shown with side walls 340.

Figure 3B:
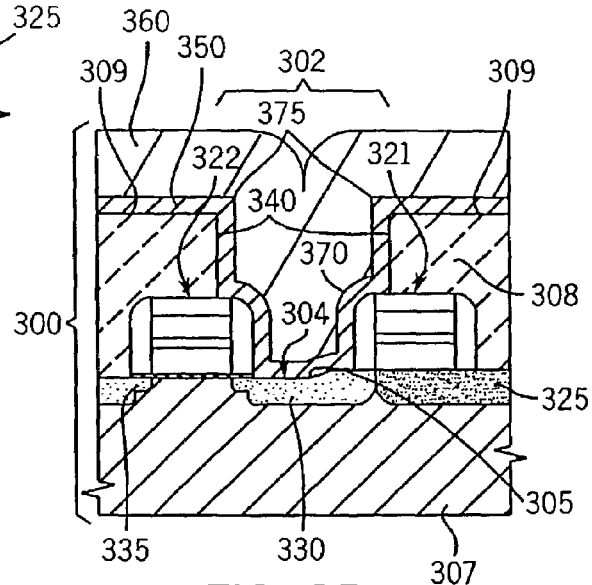
FIG. 3B is a cross sectional view of the device shown in FIG. 3A in a further stage of fabrication.

With reference now to FIG. 3B, a conductive material 350 is deposited inside the opening 302 in the manner as heretofore described. As previously set forth, the conductive material is preferably a transition element metal, e.g. a Group VIII material, and more desirably is platinum, a platinum compound or a platinum alloy, but other conductive material metals as previously mentioned may also be utilized. The conductive material is formed over the sidewalls 340 of the layer 308, as well as over the sides of the gate stacks 321 and 322, and over the exposed portion 304 of the top surface 305 of the substrate 307. Preferably, the conductive material substantially covers the top surface portion 309 of the insulative layer 308. Further shown in FIG. 3B is a fill material 360 which is next deposited over the conductive material 350, again as previously described. The fill material 360 is desirably tungsten or a tungsten compound such as tungsten nitride, or any other suitable material which is harder than the underlying conductive material 350, and can thus include titanium and titanium compounds such as titanium nitride. As shown in FIG. 3B, the fill material preferably substantially covers the top edge portions 375 of the conductive material 350. Even more preferably, the fill material 360 is substantially co-extensive with the conductive material 350 over the top surface 309 of the layer 308.

Figure 3C:
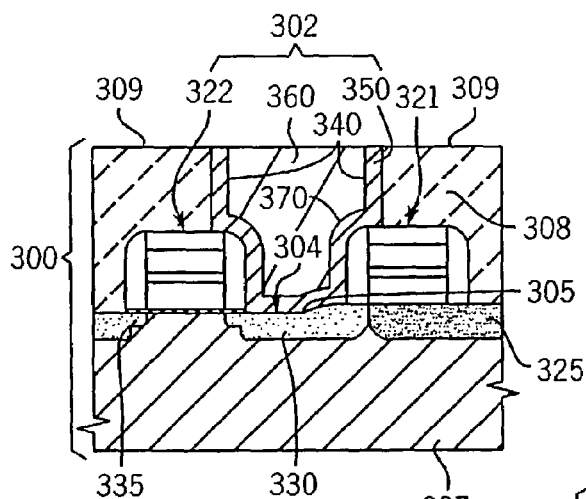
FIG. 3C is a cross sectional view of the device shown in FIG. 3B in a further stage of fabrication.

As now shown in FIG. 3C, the portions of the conductive material 350 and the overlying fill material 360 outside of the contact opening 302 are then removed, preferably by one or more planarization techniques as described above. As a result, the top portions of the conductive material 350 are desirably substantially coplanar with the top surface 309 of the layer 308.

Figure 3D:
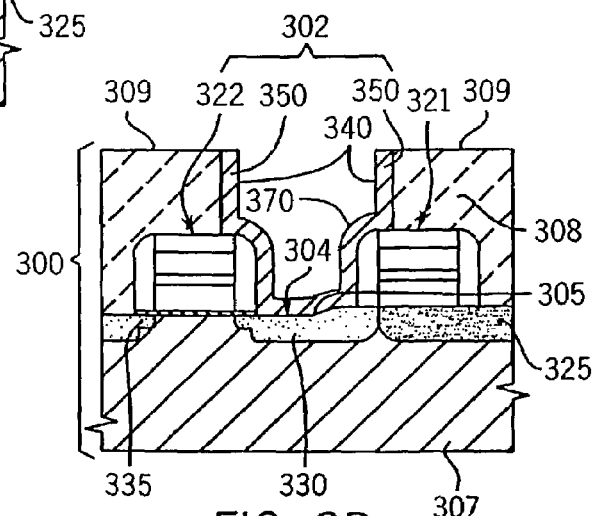
FIG. 3D is a cross sectional view of the device shown in FIG. 3C in a further stage of fabrication.

In FIG. 3D the fill material 360 is now removed from the inside of the contact opening 302. It is desirable that substantially all of the fill material 360 be removed from the device 300 using a technique such as etching, etc., as heretofore described. The device shown in FIG. 3D is now ready for further fabrication according to the needs of the skilled artisan, including further metallization or additional deposition of other conductive materials inside contact opening 302 over conductive material 350. As shown in FIG. 3D, the top portions of the conductive material 350 are still preferably substantially coplanar with the top surface 309 of the layer 308, and are not substantially deformed, bent or overhanging into the opening 302.

Figure 4A:
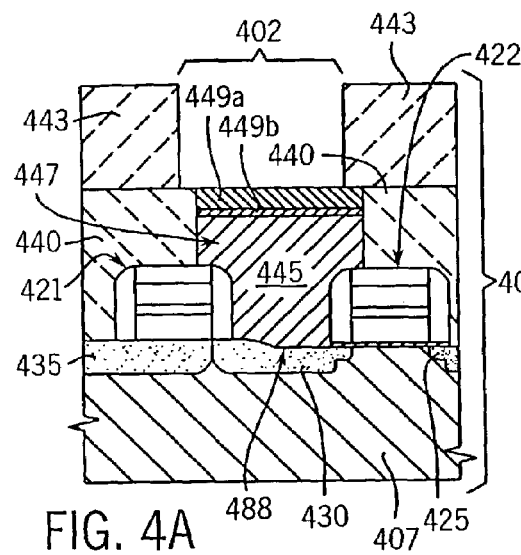
FIG. 4A is a cross-sectional view of a further embodiment of a semiconductive device in an intermediate stage of fabrication.

Referring now to FIG. 4A, there is set forth a further embodiment of the invention. A semiconductive device 400 is shown fabricated using conventional processing techniques through the formation of an opening 402. Such processing is performed prior to depositing a bottom electrode structure on the surfaces defining the opening 402 using one of the methods described in accordance with the present invention. The device 400 includes field oxide region 425 formed in substrate 407, as well as source and drain regions 430, 435 which may be suitably doped. Also shown are gate stack transistors 421 and 422, which each may alternately function as a word line or field effect transistor. A first layer 440 of an insulative material, e.g. BPSG, has been formed over the substrate 407 of the structure 400. A plug 445 of electrically conductive material, e.g. polysilicon, has been formed in an opening 447 provided in layer 440 to provide electrical communication between a top surface 448 of the active source/drain region 430 of the substrate 407 and a storage cell capacitor to be later formed thereover. One or more barrier layers may be formed over the polysilicon plug 445, including layers 449a and 449b as shown in FIG. 4A. For example, one or more of the barrier layers may be comprised of such compounds as titanium nitride, tungsten nitride, titanium silicide, or any other metal nitride or metal silicide layer which can function as a barrier layer. A second insulative layer 443 is formed over the first insulative layer 440. The opening 402 is defined in the second layer 443 using available methods such as etching.

Figure 4B:
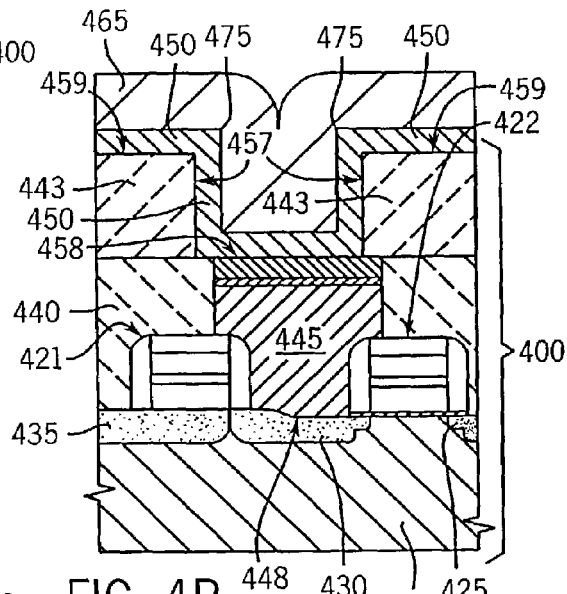
FIG. 4B is a cross sectional view of the device shown in FIG. 4A in a further stage of fabrication.

With reference now to FIG. 4B, a conductive material 450 is deposited inside the opening 402 in the manner as heretofore described. As previously set forth, the conductive material is preferably a transition element metal or a Group IIIa or IVa metal, and more desirably is a Group VIII material, including platinum, platinum compounds and platinum alloys. The conductive material is formed over the sidewalls 457 of the layer 443, and over the bottom portion 458 of the opening 402. Even more preferably the conductive material 450 extends over the top surface 459 of the insulative layer 443.

Further shown in FIG. 4B is a fill material 465 which is next deposited over the conductive material 450, again as previously described. The fill material 465 is desirably tungsten or a tungsten compound such as tungsten nitride, or any other suitable material which is harder than the underlying conductive material 450. Desirably, the fill material 465 substantially covers, e.g. is co-extensive with the top corner segments 475 of the conductive material. More desirably, the fill material is substantially co-extensive with the conductive material which is formed on the top surface 459 of the layer 443.

Figure 4C:
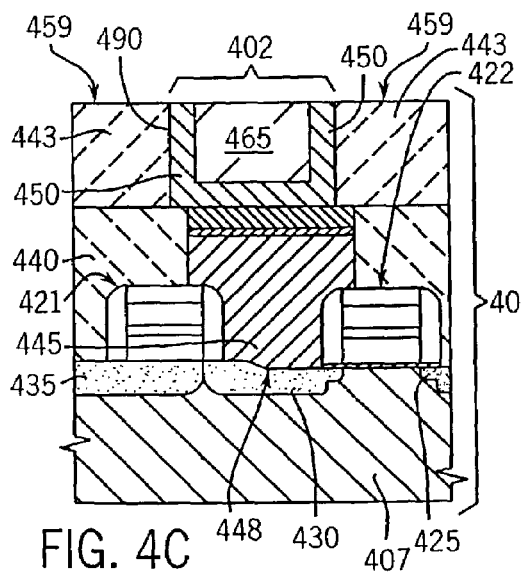
FIG. 4C is a cross sectional view of the device shown in FIG. 4B in a further stage of fabrication.

As shown in FIG. 4C, the portions of the conductive material 450 and the overlying fill material 465 outside of the contact opening 402 are now removed, preferably by one or more planarization techniques as described above. As a result, the top portions of the conductive material 450 are desirably substantially coplanar with the top surface 459 of the layer 443.

Figure 4D:
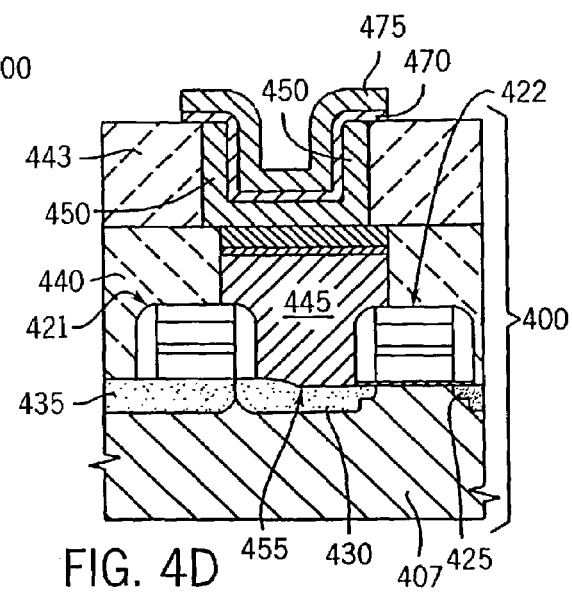
FIG. 4D is a cross sectional view of the device shown in FIG. 4C in a further stage of fabrication.

In FIG. 4D the fill material 465 is removed from the inside of the contact opening 402. It is desirable that substantially all of the fill material 465 be removed from the device 400 using a technique such as etching, etc., as heretofore described. The conductive material 450 thus functions as a capacitor bottom electrode as shown in FIG. 4D. A dielectric material layer 470 is formed over the bottom electrode 450 using a process known in the art. For example, the dielectric layer may be any material having a suitable dielectric constant such as $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], (Pb, La)$TiO_3$ [PLT], $KNO_3$, $Al_2O_3$, $Si_3N_4$, $SiO_2$, $Ta_2O_5$, $TiO_2$, $ZrO_2$, $HfO_2$ and $LiNbO_3$, among others. Thereafter, a second or top electrode 475 is formed over the dielectric material 470. In one embodiment of the invention, the second electrode 475 may also be formed of a Group VIII metal, preferably platinum or a platinum alloy, as well as other conductive material metals as heretofore described. It will be recognized by one skilled in the art, however, that either one or both of the electrodes may be formed of any conductive material generally used for capacitor electrode structures. It is also within the scope of the invention that each electrode be one of several layers forming an electrode stack. The structure in FIG. 4D can thus function as a typical storage capacitor.

Figure 5A:
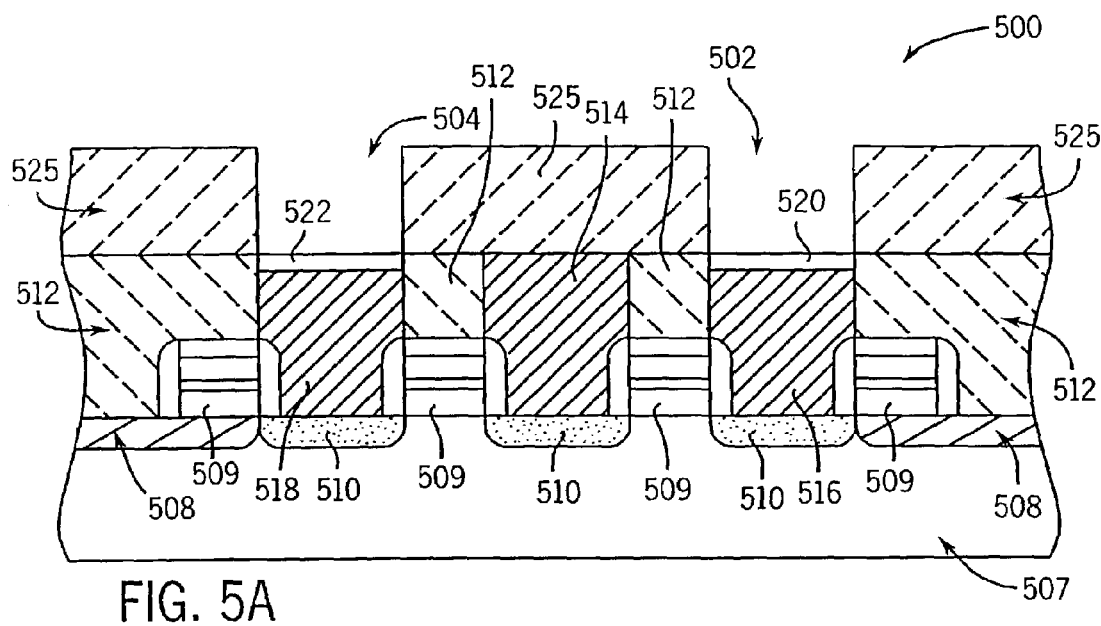
FIG. 5A is a cross-sectional view o a further embodiment of a semiconductive device in an intermediate stage of fabrication.

Referring now to FIG. 5A, there is shown another embodiment of the present invention. According to this embodiment, it is possible to fabricate a bit line conductive plug. A semiconductive device 500 is shown fabricated using conventional processing techniques through the formation of openings 502 and 504 over the substrate 507. The device 500 includes field oxide regions 508. Also shown are gate stack transistors 509, which each may alternately function as a word line or field effect transistor. The device 500 further includes suitably doped source/drain regions 510 which are formed in the substrate 507 according to processes available to the skilled artisan. A first layer 512 of an insulative material, e.g. BPSG, has been formed over the substrate 507. A first conductive plug 514 has been formed in an opening provided in layer 512 to provide electrical communication between the source/drain region 510 in the substrate 507 and a bit line conductive plug to be later formed thereover.

The first conductive plug 514 may be formed of a suitably conductive material, such as polysilicon for example. Second and third conductive plugs 516, 518 have also been formed in openings provided in layer 512 to provide electrical communication between the source/drain regions 510 and a storage cell capacitor which may formed thereover. The second and third conductive plugs are also formed of suitably conductive material which may be the same or different, but is preferably polysilicon. One or more barrier layers 520, 522 have been formed over the second and third conductive plugs 516, 518. As set forth above, the barrier layer(s) may be formed from such compounds as titanium nitride, tungsten nitride, titanium silicide, or any other metal nitride or metal silicide layer. Thereafter, a second insulative layer 525 is formed with openings 502, 504 defined therein according to methods known in the art. Openings 502, 504 are preferably contact openings which are formed using available etching, e.g. wet or dry etching, techniques.

Figure 5B:
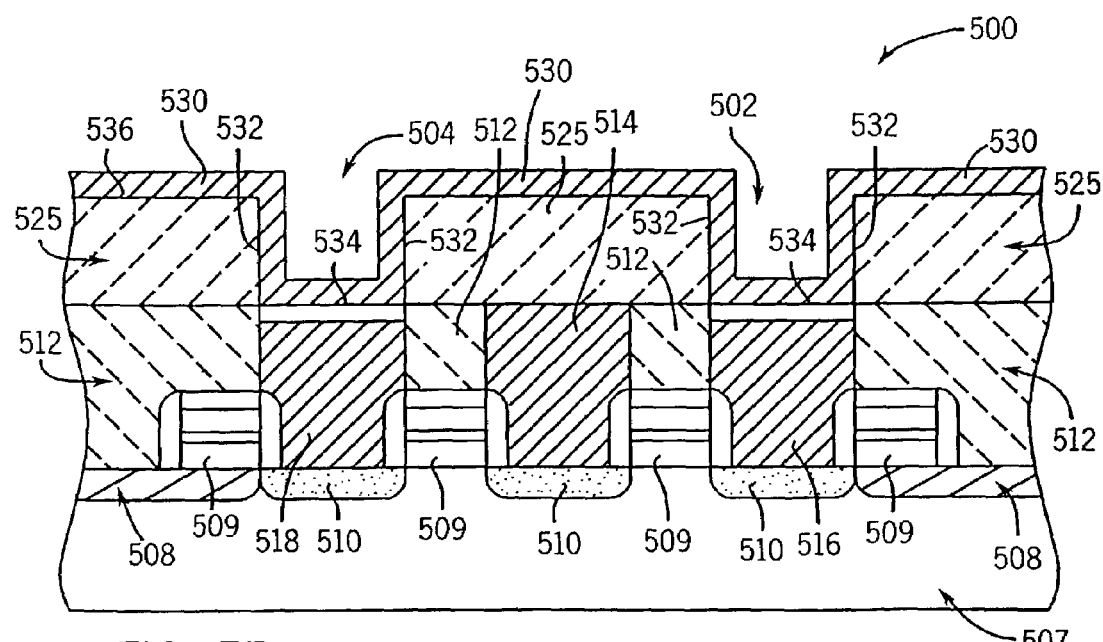
FIG. 5B is a cross sectional view of the device shown in FIG. 5A in a further stage of fabrication.

With reference now to FIG. 5B, a conductive material 530 is deposited inside the openings 502, 504 in the manner as heretofore described. As previously set forth, the conductive material is preferably a Group VIII material, and more desirably is platinum or a platinum alloy, but other transition element metals (e.g., copper, silver and gold), as well as Group IIIa and IVa metals, e.g. aluminum, may also be utilized. The conductive material is formed over the sidewalls 532 inside of the openings 502, 504 in the insulative layer 525, and over the bottom portions 534 of the openings. The conductive material is also preferably formed over the top surface 536 of the layer 525.

Figure 5C:
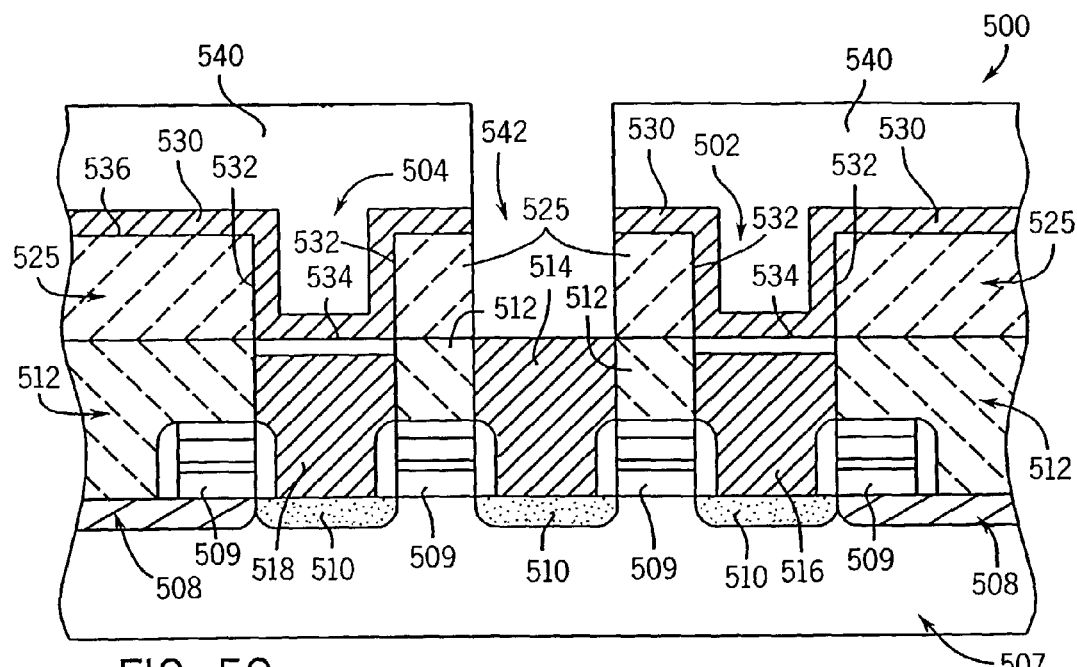
FIG. 5C is a cross sectional view of the device shown in FIG. 5B in a further stage of fabrication.

Further shown in FIG. 5C is a protective layer 540 which is next deposited over the structure 500, including the conductive material 530, using available techniques. Preferably, the protective layer 540 is a photoresist layer. The protective layer 540 is used to pattern an opening in the insulative layer 525 which will serve as the contact opening 542 with the polysilicon plug 514 for the bit line conductive plug to be subsequently formed. The contact opening 542 is then etched using suitable etching techniques, for example, a dry etch using $CF_4$, $CHF_3$ and argon gases. In FIG. 5B, the etch stop is the top surface of the polysilicon plug 514.

Figure 5D:
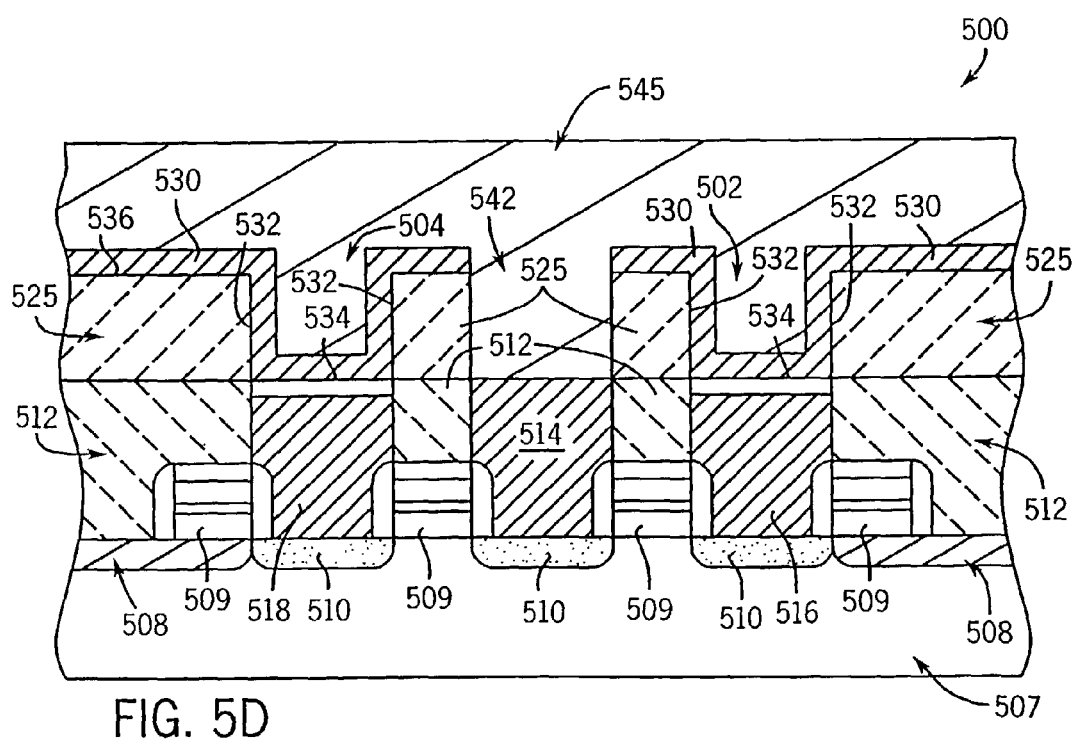
FIG. 5D is a cross sectional view of the device shown in FIG. 5C in a further stage of fabrication.

Thereafter, as shown in FIG. 5D, the protective layer 540, e.g. the photoresist layer, is removed. Next, fill material 545 is deposited over the structure 500 as heretofore described. The fill material is desirably a hard metal, metal alloy or metal compound, such as tungsten or a tungsten compound like tungsten nitride, or any other suitable material which is harder than the underlying conductive material 530. If desired, the fill material deposition step may be preceded by a titanium or titanium nitride deposition step in the contact opening 542. The titanium material will coat the inside of the contact opening 542 to improve the adhesion of metal within the insulative layer 525. The titanium material may be deposited using a CVD process, for example.

Figure 5E:
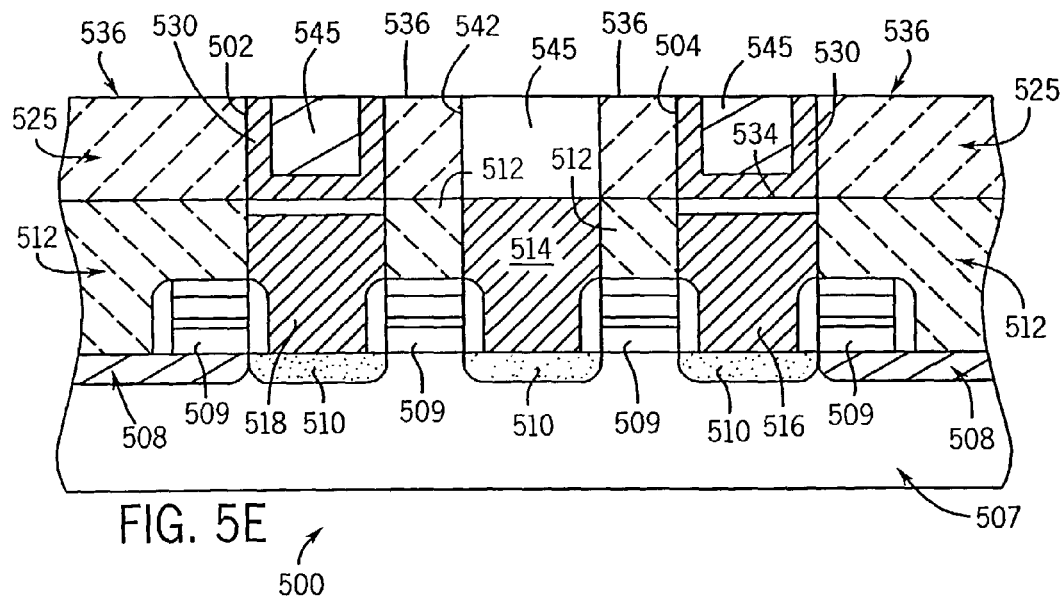
FIG. 5E is a cross sectional view of the device shown in FIG. 5D in a further stage of fabrication.

As next shown in FIG. 5E, the portions of the conductive material 530 and the overlying fill material 545 outside of the contact openings 502, 504, 542 are then removed, preferably by one or more planarization techniques, e.g. CMP, as described above. The metal-containing fill material 545 functions to protect the conductive material from spreading or smearing into the contact openings 502, 504. As a result of planarization, the top portions of the conductive material 530 are desirably substantially coplanar with the top surface 536 of the insulative layer 525. In addition, the top portion of the fill material 545 inside the contact openings 502, 504, and 542 is also preferably substantially co-planar with the top surface 536 of the layer 525.

Figure 5F:
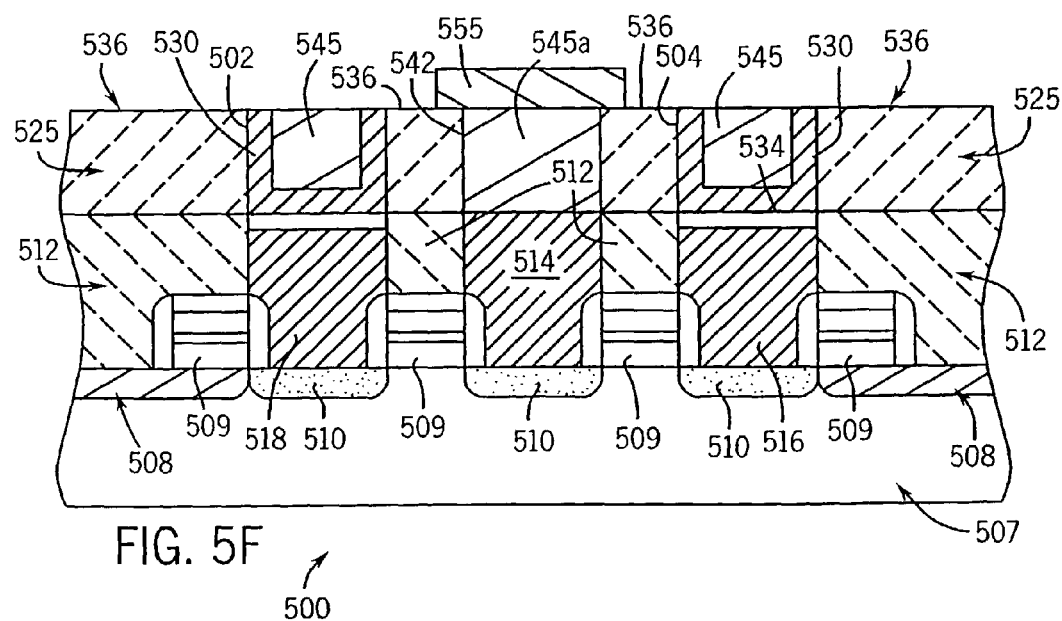
FIG. 5F is a cross sectional view of the device shown in FIG. 5E in a further stage of fabrication.
Figure 5G:
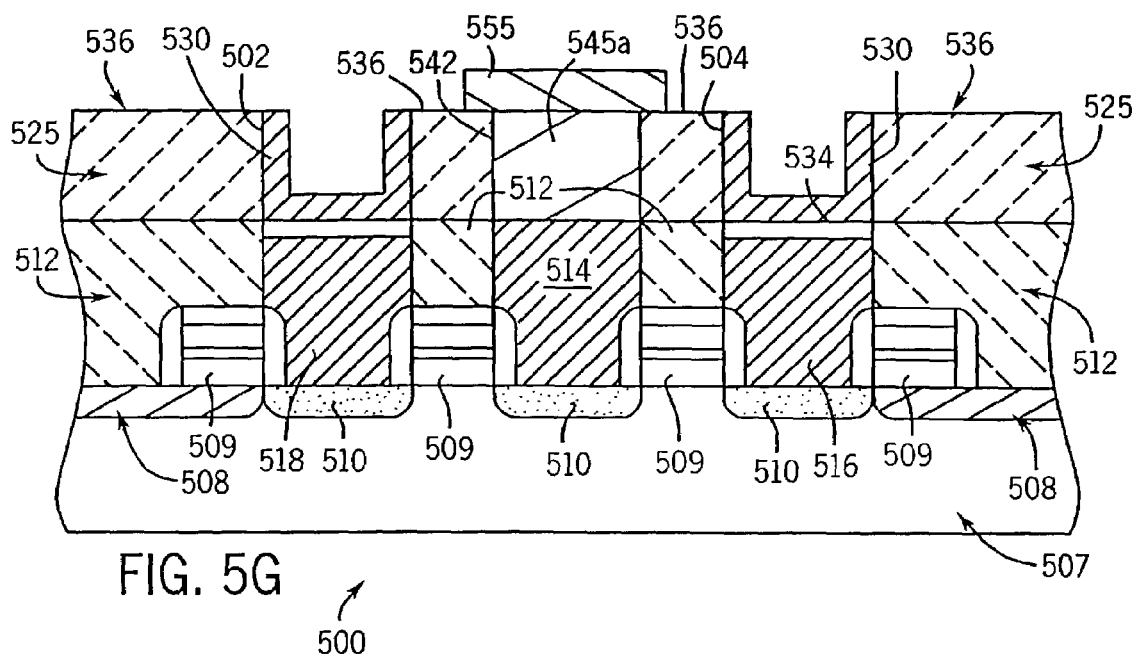
FIG. 5G is a cross sectional view of the device shown in FIG. 5F in a further stage of fabrication.

Referring now to FIGS. 5F and 5G, the fill material inside contact opening 542 now forms a bit line conductive plug 545*a* in contact with the conductive polysilicon plug 514. Next, a protective cap 555 is deposited over the bit line conductive plug 545*a*. The protective cap is desirably formed from a substantially non-conductive material such as an oxide. Thereafter as shown in FIG. 5G, the fill material 545 is removed from the inside of the contact openings 502, 504. It is desirable that substantially all of the fill material 545 be removed from the contact openings 502, 504 using a technique such as etching, etc., as heretofore described. The conductive material 530 can thus function as a capacitor bottom electrode as was illustrated in FIGS. 4A through 4D.

Figure 6:
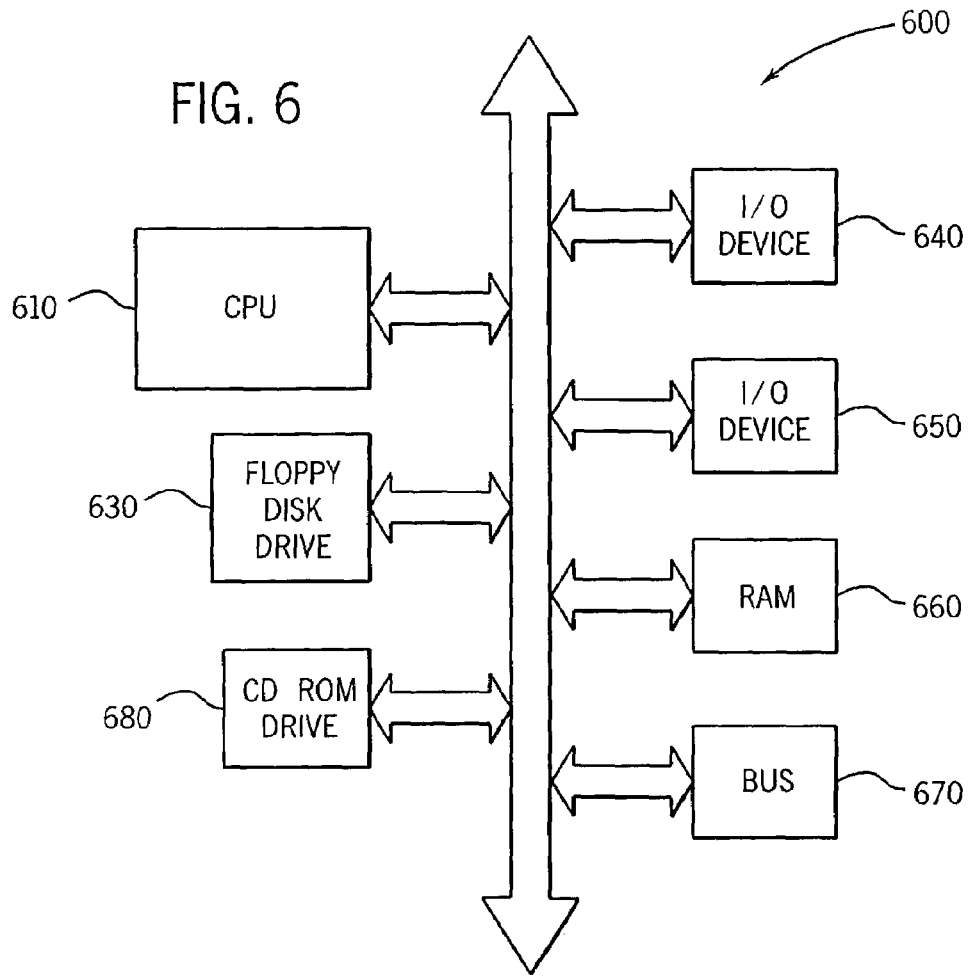
FIG. 6 is a block diagram of a processor-based system which includes integrated circuits that utilize the structures constructed in accordance with the present invention.

Due at least in part to their improved electrical characteristics, the structures herein described have wide applicability in the semiconductor industry. A typical processor system which includes integrated circuits that utilize one or more of the structures formed in accordance with the present invention is illustrated generally at 600 in FIG. 6. A processor system, such as a computer system, for example, generally comprises a central processing unit (CPU) 610, for example, a microprocessor, that communicates with one or more input/output (I/O) devices 640, and a hard drive 650 over a bus system 670 which may include one or more busses and/or bus bridges. The computer system 600 also includes a hard disk drive 620, a floppy disk drive 630, a random access memory (RAM) 660, a read only memory (ROM) 680 and, in the case of a computer system may include other peripheral devices such as a compact disk (CD) ROM drive 630 which also communicate with CPU 610 over the bus 670. The invention may be used in one or more of the processor, RAM and ROM, or a chip containing a processor and on board memory. While FIG. 6 shows one exemplary computer system architecture, many others are also possible.

The foregoing description is illustrative of exemplary embodiments which achieve the objects, features and advantages of the present invention. It should be apparent that many changes, modifications, substitutions may be made to the described embodiments without departing from the spirit or scope of the invention. The invention is not to be considered as limited by the foregoing description or embodiments, but is only limited by the scope of the appended claims.

What is claimed as new and desired to be protected by Letters Patent of the United States is:

1. A structure for use in providing a conductive material in an opening, comprising:
    a substrate;
    an insulative material over said substrate;
    a conductive material formed over at least a portion of a surface of said opening and over at least a portion of the surface of said insulative material outside of said opening, said conductive material forming a bottom electrode of a capacitor;
    a removable tungsten-containing fill material formed over and in contact with at least a portion of said conductive material which is inside said opening and which is over said insulative material outside of said opening, wherein said tungsten-containing fill material at least partially fills said opening,
    wherein said tungsten-containing fill material is co-extensive with said conductive material on said insulative material and wherein said conductive material is at least one member selected from the group consisting of transition element metals, Group IIIa metals and Group IVa metals.

2. The structure of claim 1, wherein said opening further comprises a pair of opposing side walls and a bottom surface.

3. The structure of claim 2, wherein said conductive material is formed over substantially all of the surface of said opening.

4. The structure of claim 1, wherein said conductive material is substantially co-extensive with the surface of said insulative material outside of said opening.

5. The structure of claim 1, wherein said insulative material is at least one member selected from the group consisting of silicon dioxide and BPSG.

6. The structure of claim 5, wherein said insulative material is BPSG.

7. The structure of claim 1, wherein said tungsten-containing fill material is substantially harder than said conductive material and is substantially co-extensive with said conductive material which is over said insulative material.

8. The structure of claim 7, wherein said tungsten-containing fill material is tungsten or tungsten nitride.

9. The structure of claim 1, wherein said conductive material is at least one member selected from the group consisting of platinum, rhodium, iridium osmium, copper, silver, gold and aluminum.

10. The structure of claim 9, wherein said tungsten-containing fill material substantially fills said opening.

11. A structure for use in providing a conductive material in an opening, comprising:
    a substrate;
    an insulative material over said substrate;
    a conductive material formed over substantially all of the inside surface of said opening, said conductive material forming an electrode of a capacitor;
    a removable tungsten-containing fill material formed over and in contact with said conductive material, wherein said tungsten-containing fill material substantially fills said opening, and further wherein said conductive material and said tungsten-containing fill material are co-planar at the top of said opening,
    wherein said inside surface of said opening comprises a pair of opposing side walls and a bottom surface, and wherein said bottom surface of said opening is over a conductive plug.

12. The structure of claim 11, wherein said insulative material has a top surface such that said conductive material and said tungsten-containing fill material are substantially co-planar with said top surface.

13. The structure of claim 11, wherein said conductive material is platinum or a platinum alloy.

14. The structure of claim 13, wherein said conductive material is planarized together with said tungsten-containing fill material.

15. The structure of claim 14, wherein said conductive material is substantially undeformed.

* * * * *